United States Patent [19]

Dadds

[11] Patent Number: 4,914,380

[45] Date of Patent: Apr. 3, 1990

[54] SIGNAL RECEIVING ARRANGEMENT

[75] Inventor: Alan F. Dadds, Hartfield, England

[73] Assignee: U.S. Philips Corp., New York, N.Y.

[21] Appl. No.: 281,575

[22] Filed: Dec. 8, 1988

[30] Foreign Application Priority Data

Dec. 18, 1987 [GB] United Kingdom ................. 8729515

[51] Int. Cl.$^4$ ............................................ G01R 23/14
[52] U.S. Cl. ................. 324/79 R; 324/77 R
[58] Field of Search ............... 324/77 R, 78 R, 78 D,
324/79 R, 79 D; 455/315, 189

[56] References Cited

U.S. PATENT DOCUMENTS 4,352,209 9/1982 Ma ........................................ 455/315
4,569,084 2/1986 Takahama ........................... 455/189

*Primary Examiner*—Michael J. Tokar

*Attorney, Agent, or Firm*—Emmanuel J. Lobato

[57] ABSTRACT

A signal receiving arrangement comprising first and second groups (14, 16) of frequency down-converting stages (18 to 24 and 26 to 34), each stage including a mixer (40) and a local oscillator (42) for frequency down-converting a signal applied to the stages (18 to 24 and 26 to 34), the local oscillator frequencies of successive stages (18 to 24 and 26 to 34) being progressively higher with the frequency differences between successive stages in each group forming an arithmetic progression, wherein the frequency down-converted outputs of the stages of each group are combined and the pair of residue frequencies formed by mixing down the input signal are used to determine on the basis of the Chinese remainder theorem which stage in each group was operative on the input signal and thereby ascertain the actual frequency of the input signal.

17 Claims, 4 Drawing Sheets

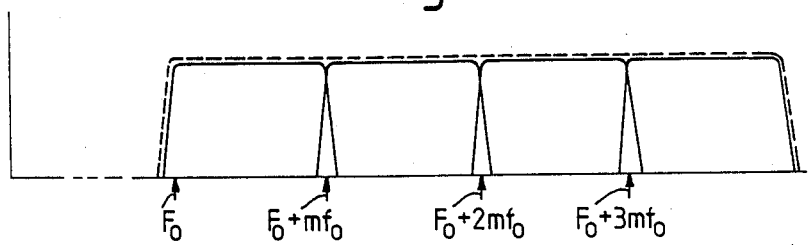
Fig. 2
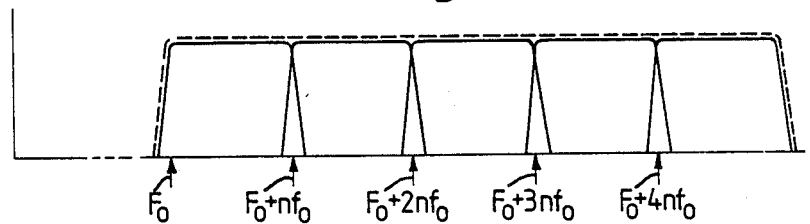
Fig. 3
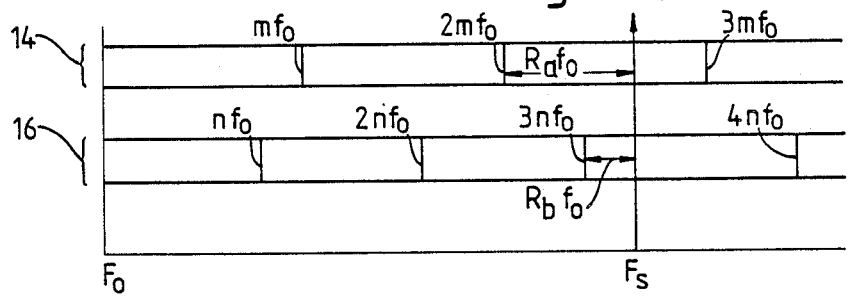
Fig. 4
Fig. 5
| mod 43 / mod 49 | 27 | 28 | 29 | 30 |
|---|---|---|---|---|
| 3 | 199 | 1963 | 1620 | 1277 |
| 4 | 543 | 200 | 1964 | 1621 |
| 5 | 887 | 544 | 201 | 1965 |
| 6 | 1231 | 888 | 545 | 202 |

4,914,380

1

SIGNAL RECEIVING ARRANGEMENT

BACKGROUND OF THE INVENTION

The present invention relates to a signal receiving arrangement having particular, but not exclusive use, in wideband radio signaling reception.

A well known apparatus for receiving radio signals is the traditional superhet receiver which is manually tunable over a frequency band which may be divided into sub-bands, each sub-band being selectably manually. A drawback to such a receiver is that unless one is fortuitously tuned into a frequency at which a transitory event occurs it will be missed. Also, searching over the frequency band takes a relatively long time so that the chances of detecting a transitory event having a short duration are low.

These disadvantages are overcome by a receiving arrangement in which the observable frequency band is divided into a plurality of substantially contiguous sub-bands and a narrowband receiver is allocated to each sub-band. However such an arrangement is relatively expensive in hardware and requires monitoring of the output of each receiver.

This problem can be mitigated by an arrangement in which signals in each sub-band are frequency down converted to one and the same sub-band which can be monitored by one person. However although an incoming signal of interest will be recorded/heard a difficulty arises in determining the actual frequency of the incoming signal because it is not known in which of the sub-bands the signal has occurred.

SUMMARY OF THE INVENTION

An object of the present invention is to identify the sub-band in which an incoming signal has occurred.

According to the present invention there is provided a signal receiving arrangement comprising first and second groups of frequency down-converting stages, a signal input coupled to the stages of each group, each stage comprising a mixer and a local oscillator, the local oscillators of successive stages in each of the first and second groups producing different frequencies, the differences in frequency between local oscillators of correspondingly numbered stages in the first and second groups forming an arithmetic progression, means for combining the frequency down-converted outputs of each group of stages and means for determining the frequency of the input signal by measuring the frequency of the frequency down-converted signals produced at the output of each of the combining means and treating the measurements obtained as residues in order to determine the increment in the arithmetic progression on the basis of the Chinese remainder theorem.

The frequencies of the local oscillators of the first and second groups may be incremented in accordance with respective continuous arithmetic progressions, the increments between successive stages of each group being $mf_o$ and $nf_0$, respectively, where $f_0$ is the resolution of the receiving arrangement and m and n are at least pairwise relatively prime integers.

In an embodiment of the present invention each stage includes a bandpass filter coupled between the signal input and the mixer of that stage, the pass band of each filter being such that the intended overall bandwidth of the receiving arrangement is divided into substantially contiguous bands of substantially the same bandwidth, the filter capable of passing the lowest band being in the stage of lowest significance and so on. An advantage of providing the bandpass filters is that each frequency down-converted stage operates as a single sideband receiver and as a result each pair of residues represents a unique R.F. frequency.

If desired the provision of bandpass filters can be avoided and a non-ambiguous result obtained by means of the receiving arrangement comprising three groups of stages. The local oscillator frequencies of which groups of stages form different arithmetic progressions in which the frequency differences between the successive local oscillator frequencies of the respective groups are $mf_o$, $nf_o$ and $pf_o$, where m, n and p are relatively prime numbers. Three IFs are obtained which constitute residues for calculating the original input signal frequency using the Chinese remainder theorem.

The arrangement may further comprise error correction means in said means for determining the frequency of the input signal, the error correcting means having means for storing a restricted range of values of the product of the relatively prime numbers, means in response to detecting a value lying outside said range for incrementing and/or decrementing at least one of the pair of residue values obtained by at least unity and means for checking if the value obtained by said incrementing and/or decrementing lies within said restricted range of values. Such error correcting means enables the receiver arrangement to correct for errors in the measurement of the pairs of frequency down-converted signals at the outputs of the combining means and resolve problems of ghosting when multiple input-signals are present simultaneously.

If it is desired to monitor two non-contiguous portions of the frequency spectrum then an embodiment of the invention comprises two groups of X stages arranged so that for example the first y stages of each group cover the first portion of the frequency spectrum and the remaining z stages of each group cover the second portion of the frequency spectrum, where $X = y + z$. The local oscillator frequencies selected for the stages are chosen to conform to the two criteria. Firstly that for each group of stages the local oscillator frequencies follow respective but non-continuous arithmetic progressions. Secondly the differences in frequency between correspondingly numbered stages of each group form a continous arithmetic progression. For practical reasons the relatively prime numbers chosen are close to each other so that the portions of the spectrum covered by each group are not excessively different.

In the case of an embodiment having three groups of stages the same two criteria apply when covering non-contiguous portions of the frequency spectrum.

The present invention will now be described, by way of example, with reference to the accompanying drawings, wherein:

BRIEF DESCRIPTION OF THE DRAWINGS

FIGS. 2 and 3 illustrate in broken lines the desired overall bandwith to be covered by the signal receiving arrangement made in accordance with the present invention, and in full lines shows the sub-bands within the overall bandwidth, FIG. 4 illustrates how the residues $R_a f_o$ and $R_b f_o$ for a particular input signal $F_2$ are produced, FIG. 5 is a portion of look-up tables for particular residue values of mod. 43 and mod. 49.

DETAILED DESCRIPTION OF THE DRAWINGS

Figure 1:
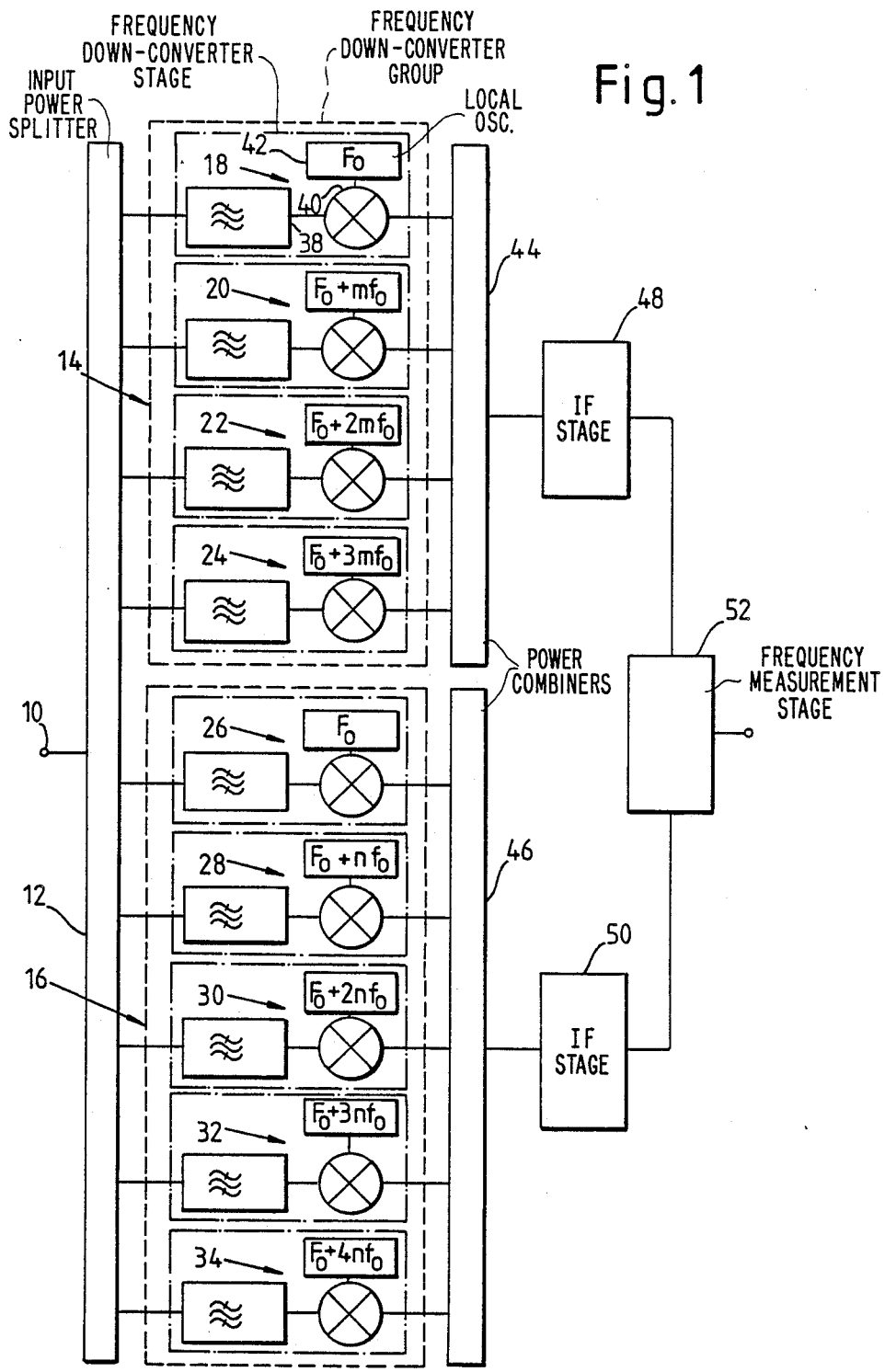
FIG. 1 is a block schematic diagram of an embodiment of the present invention.

Referring to FIGS. 1 to 3, the signal receiving arrangement comprises an input signal terminal 10 which is connected to a power splitter 12. Two groups 14, 16, of frequency down-converters 18 to 24 and 26 to 34 have signal inputs coupled to the power splitter 12. The structure of each down-converter is essentially the same and accordingly only the stage 18 will be described. The stage 18 comprises a bandpass filter 38 connected to one input of a mixer 40, and a local oscillator 42 connected to a second input of the mixer. Power combiners 44, 46 respectively combine the outputs of the mixers in the groups 14, 16. IF stages 48, 50 are connected respectively to the power combiners 44, 46 and a frequency measurement stage 52.

The input power splitter 12 and the bandpass filters 38 are provided primarily for image rejection and may be omitted if desired. However, when provided, the filters 38 in each group have different pass bands, shown in full lines in FIGS. 2 and 3, which pass bands lie within the overall passband, shown in broken lines in FIGS. 2 and 3, and are contiguous with each other. In this situation each stage operates as a single sideband frequency down conversion stage.

The frequencies of the local oscillators 42 in each group are different. In the case of the group 14, the local oscillator frequency is $F_o$ for the stage 18 but for the stages 20, 22 and 24 their local oscillator frequencies are incremented stage by stage in accordance with an arithmetic progression, each increment comprising $mf_o$, where $f_o$ is the resolution of the receiver arrangement. In the group 16, the local oscillator frequencies are incremented in accordance with another arithmetic progression, with the local oscillator of the stage 26 being $F_o$ and the increments being $nf_o$.

In this example m and n are prime integers or pairwise relatively prime integers, for example 43 and 49 which will be used in a later explanation. As the local oscillator frequencies of each group follow respective arithmetic progressions, then the frequency differences between correspondingly numbered stages in each group will follow an arithmetic progression. The frequency down-converted signals in each group will lie in an overall IF band which is filtered in the respective IF stages 48, 50. Although a frequency down-converted signal will be in the frequency band of the IF stage and in consequence will be detected, it is not possible by a simple measurement of its frequency to determine which stage in each group frequency down-converted the input signal.

The receiving arrangement made in accordance with the present invention resolves this problem by making use of the Chinese remainder theorem. This theorem is well known and is described in the book "Fast Algorithms for Digital Signal Processing" by Richard E. Blahut and published by Addison-Wesley Publishing Company. Insofar as FIG. 1 is concerned, use is made of the feature that an integer having a value less than m.n when divided by m, termed (modulo m or mod.m), or n, (modulo n or mod. n), a pair of residues will be obtained which can be used to represent the integer. Thus for example within 2107 formed by product of 43×49, the number 199 can be represented as $$27 = 199 \text{ (mod.43)} \text{ and } 3 = 199 \text{ (mod.49)}$$

Referring now to FIG. 4, a graphical representation is given of the various local oscillator frequencies provided by the local oscillators in the respective groups 14, 16 together with the unknown frequency $F_{sl}$. For the sake of explanation within the group 14, the stage 22 frequency down-converts $F_s$ to $R_a f_o$ and within the group 16 the stage 32 frequency down-converts $F_s$ to $R_b f_o$. It is apparent that $$R_a f_o = [F_s - F_o] \text{ (mod.}m.f_o)$$

that is $$R_a = [(F_s - F_o)/f_o] \text{ (Mod.}m)$$

and $$R_b f_o = [F_s - F_o] \text{ (mod.}n f_o)$$

that is $$R_b = [(F_s - F_o)/F_o] \text{ (mod.}n).$$

In accordance with the Chinese remainder theorem $[(F_s - F_o/f_o]$ can be uniquely determined from the residues $R_a$ and $R_b$ provided it is less than the product m.n. The values of the residues can be stored in a look-up table so that the value common to these residues can be ascertained quickly. Alternatively the value could be computed which will take longer. Once having determined the integer value then this identifies the local oscillator frequency in each of the groups which produced the residues $R_a f_o$ and $R_b f_o$ and hence the value $F_s$ can be obtasined with the resolution $f_o$.

FIG. 5 shows a portion of two look-up tables operating on (mod. 43) and (mod. 49). One purpose of showing this portion of the look-up table is to illustrate that provided the range of values taken by $[(F_s - F_o)/f_o]$ is a small part of m.n. then the redundancy obtained can be used to correct errors in $R_a$ and $R_b$ and to resolve what is frequently referred to as ghosting, that is when multiple signals are present simultaneously. Thus when m=49 and n=43 the maximum unambiguous number is 2107, thus if 0 to 399 is taken as a small part of this range then numbers above 399 are discarded as impossible.

An examination of FIG. 5 can be used to illustrate how the redundancy obtained is useful. The small range around $[(F_s - F_o)/f_o] = 200$ is shown. Looking diagonally downwards from the top left hand corner it will be noted that there is a sequence 199, 200, 201 and 202. All these are less than 399. However on either side of these numbers there are effectively guard bands formed by impermissable numbers of greater than 399. Assume that 200 is the correct value. Now if due to an erroneous measurement 29 (mod. 43) and 4 (mod. 49) were obtained, then from FIG. 5 this would give a common value of 1964. Because the receiver arrangement sees that 1964 is greater than 399 it knows that there is an error in either $R_a$ or $R_b$. As part of an error correction procedure the receiver arrangement could first leave 4 (mod. 49) unchanged and take 29 (mod. 43) and decrement and increment 29 by unity and examine the results. In the former case a permissable answer of 200 is obtained from the table but in the latter one an impermissable answer of 1621 is obtained. Therefore the receiver can correct the value of $R_a$ to give a permissable answer. In a second part of the error correction procedure 29 (mod. 43) could be left unchanged and 4 (mod. 49) incremented and decremented by unity, the former provides a permissable answer of 201 whilst the latter provides an impermissable number of 1620. Thus whether 200 or 201 is taken as the correct answer, they are within one resolution cell of each other which is within normal tolerance.

Figure 6:
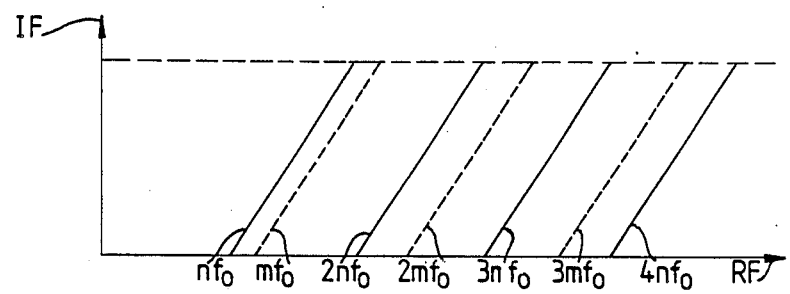
FIG. 6 is a graph of RF versus IF for the receiving arrangement shown in FIG. 1.

As mentioned earlier, each of the stages 18 to 24 and 26 to 34 can be regarded as single sideband receivers because by setting the local oscillator frequency at one end of the pass band of each of the bandpass filters, the image frequency is blocked. Consequently the IF frequency response for the stages in the respective groups are as shown in FIG. 6, the broken lines represent the IFs of some of the stages 18 to 24 and the continuous lines represent the IFs of some of the stages 26 to 34. The Ifs themselves are limited by the IF stages 48 and 50.

Figure 7:
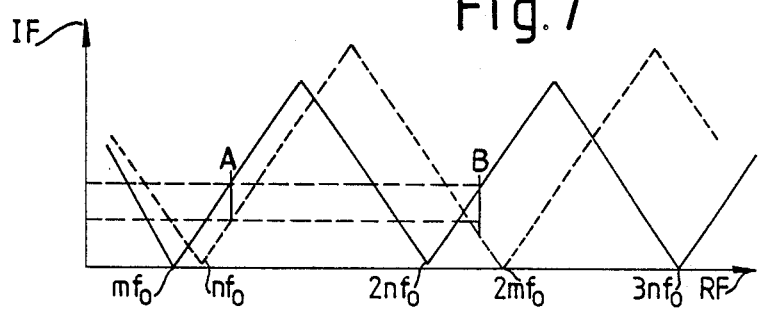
FIG. 7 is a graph of RF versus IF for a receiving arrangement of the type shown in FIG. 1 but which omits the bandpass filters.

The bandpass filters 38 could be omitted to save cost but this would be at the risk of identical pairs of residues of IFs for different RFs. Without the bandpass filters, each stage behaves as a double sideband receiver which will produce IFs as shown in FIG. 7. It will be noted that the continuous and broken line curves cross over. In consequence at the points marked A and B a pair of identical IFs, for different RFs, are obtained leading to the possibility of an incorrect frequency measurement of the incoming signal.

Figure 8:
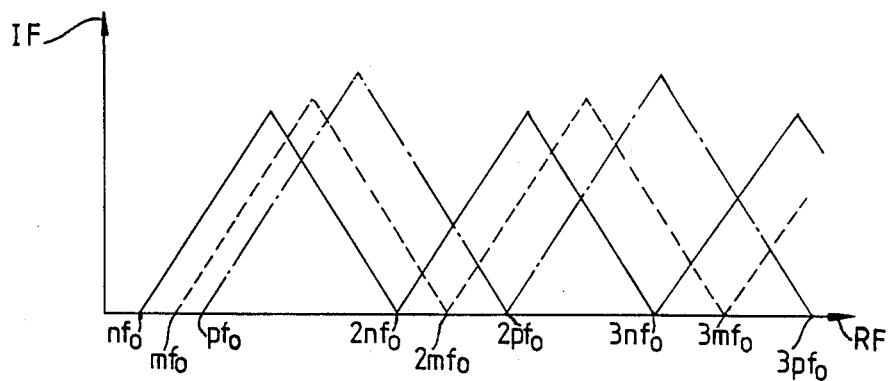
FIG. 8 is a graph of RF versus IF of a receiving arrangement comprising three groups of stages, all omitting the bandpass filters.

This ambiguity can be resolved by providing a third group of stages in addition to the groups 14 and 16; bandpass filters not being present in any of the stages. The local oscillator frequencies of the respective stages in the third group are also arranged in an arithmetic progression. The stage of the lowest significance having a local oscillator frequency $F_o$ and the local oscillator frequencies of the second and higher stages differing from each other by $pf_o$. The value of p is selected so that m, n and p are relatively prime numbers. The double sideband IFs of the respective groups of stages are shown in FIG. 8. No ambiguities will occur in the triplets of IFs obtained because although it is possible to have two RFs producing the same IFs as in FIG. 7, the third IF will be different in each case so that each set of three residues, that is $R_af_o$, $R_bf_o$ and $R_cf_o$ (not shown), will be unique to the R.F. signal being received.

For convenience of description, the embodiments described with reference to FIGS. 1 to 8 have had a first stage in each group in which the local oscillator frequency is the same, that is $F_o$. However the local oscillator frequencies of these first stages could all be different. The essential point is to ensure that the frequency band of interest is covered.

Figure 9:
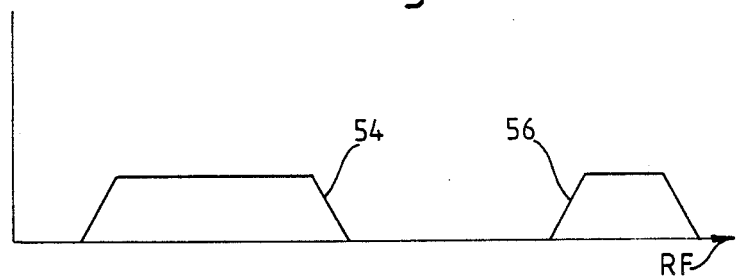
FIG. 9 is a graph showing two non-contiguous portions of the frequency spectrum to be monitored.

It is not unusual in ESM applications to want to monitor two non-contiguous portions of the frequency spectrum, for example portions 54 and 56 in FIG. 9. This can of course be done by duplicating the embodiment of FIG. 1 so that there are two receiving arrangements with each one covering its respective portions of the spectrum. This duplication of receiving arrangements can be avoided by having two groups of X stages, with say y stages of each group monitoring the portion 54 of the spectrum and z stages of each group monitoring the portion 56 of the spectrum, where X=y+z, subject to two criteria. One of these criteria is that the local oscillator frequencies of each of the stages in each group follow respective but non-continuous arithmetic progressions. The other of these criteria is that the frequency difference between the local oscillator frequencies of correspondingly numbered stages in each group form a continuous arithmetic progression.

Figure 10:
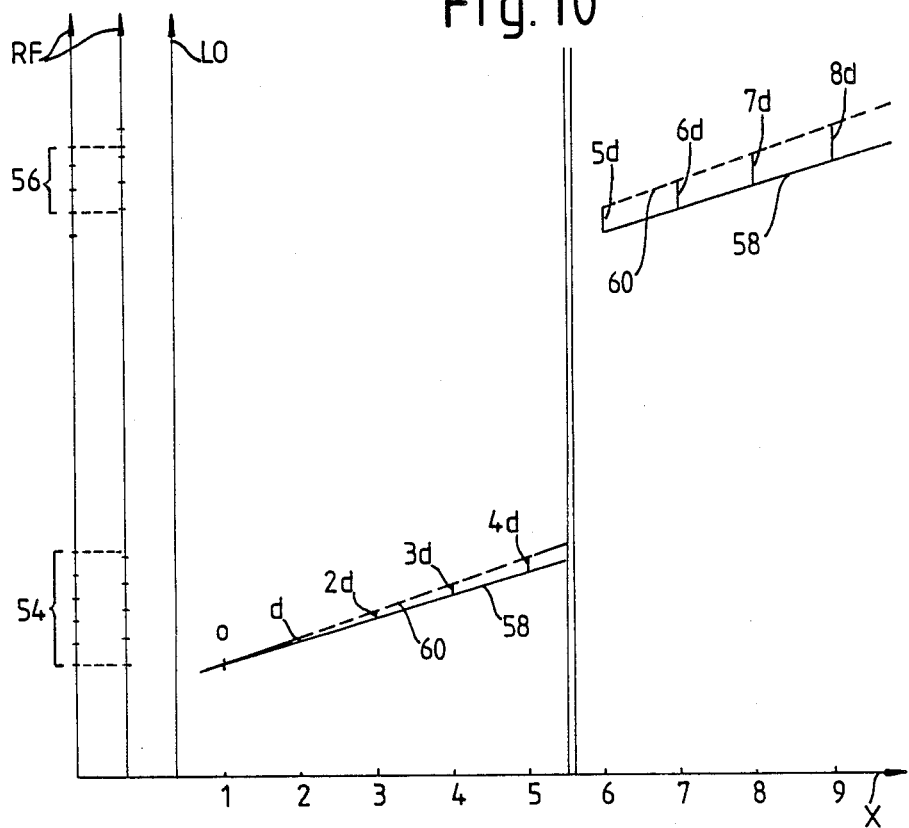
FIG. 10 is a graph which serves to explain how the receiving arrangement made in accordance with the present invention can monitor two non-contiguous portions of the frequency spectrum.

FIG. 10 illustrates these criteria graphically. For the sake of explanation it is assumed that there are 9 stages in each group that is X=9, which groups are subdivided so that five stages cover the frequency portion 54 (FIG. 9) and four stages cover the frequency portion 56. The local oscillator (LO) frequency of each stage is fixed but the fact that the LO frequencies can be linked by respective straight but interrupted continuous and broken lines 58, 60 indicates that they follow respective arithmetic progressions. Additionally the selection of the LO frequencies is such that the frequency differences between respective numbered stages, that is 0, d, 2d . . . 7d, 8d, also follow an arithmetic progression. Hence the Chinese remainder theorem can still be used to calculate the local oscillator frequencies of the stages which frequency down-converted an input signal.

For practical considerations it is preferred that the relatively prime numbers chosen are close so that the portions of the RF band covered by the stages of each group are not excessively different. The ordinates referenced RF in FIG. 10 show the sub-bands covered by the stages in each group and illustrates that there are common portions 54, 56 of the RF band which are covered by stages in both the groups.

In the case of using 3 groups of stages then the two criteria mentioned above apply.

I claim:
1. A signal receiving arrangement comprising:
first and second groups of successively ordered frequency down-converting stages for producing frequency down-converted signals,
a signal input coupled to the stages of each group for applying an input signal to each of the stages,
each stage comprising a mixer and a local oscillator,
the local oscillators of the successive stages in each of the first and the second groups producing different frequencies such that the frequencies of the local oscillators of successive stages in the first and in the second groups form respective arithmetic progressions,
combining means for combining the frequency down-converted outputs of the respective stages of each group, and
means for determining the frequency of the input signal by measuring the frequency of the frequency down-converted signals produced at the output of each of the combining means and treating the measured frequency values as residues in order to determine the interval in the respective arithmetic progressions to which the measured frequency values correspond on the basis of the Chinese remainder theorem.

2. An arrangement as claimed in claim 1, characterised in that each stage includes a mixer and a bandpass filter coupled between the signal input and the mixer of that stage, the pass band of each filter being such that the intended overall bandwidth of the receiving arrangement is divided into substantially contiguous bands of substantially the same bandwidth; the filter capable of passing the lowest band being in the first stage of successive frequency down-converting stages.

3. An arrangement as claimed in claim 1 or 2, characterised in that the frequencies of the local oscillators of the first and second groups are incremented in accordance with respective continuous arithmetic progressions, the increments between successive stages of each group being $mf_o$ and $nf_o$, respectively, where $f_o$ is the resolution of the receiving arrangement and m and n are pairwise relatively prime integers.

4. An arrangement as claimed in claim 1 or 2, characterised in that the local oscillator frequency of a first stage in each of said first and second groups is the same.

5. An arrangement as claimed in claim 3, characterized in that the means for determining the frequency of the input signal comprises means forming a look-up table of the residues of dividing an input signal by modulo m and modulo n.

6. An arrangement as claimed in claim 1, characterised by a third group of frequency down-converting stages coupled to said signal input, each stage comprising a mixer and local oscillator, the local oscillator frequencies of the successive stages of the third group being different, the differences in frequency between corresponding numbered stages of the first and third groups and of the second and third groups forming respective arithmetic progressions, and means for combining the frequency down-converted outputs of the stage in the third group, characterised in that the means for determining the frequency of the input signal utilises the measurements obtained from the respective combining means as a triplet of residues in determining the in each of the respective arithmetic progressions to which the measured frequency values correspond on the basis of the Chinese remainder thereon.

7. An arrangement as claimed in claim 6, characterised in that the frequencies of the local oscillators of the first, second and third groups are incremented in accordance with respective continuous arithmetic progressions, the increments between successive stages of each group being $mf_o$, $nf_o$ and $pf_o$, where $f_o$ is the resolution of the receiving arrangement and m, n and p are relatively prime integers.

8. An arrangement as claimed in claim 7, characterised in that the means for determining the frequency of the input signal comprises means for forming a look-up table of the residues of dividing an input signal by modulo m, modulo n and modulo p.

9. An arrangement as claimed in claim 6, 7 or 8, characterised in that the local oscillator frequency of a first stage in each of said first, second and third groups is the same.

10. An arrangement as claimed in any one of claims 7 or 8, characterised by error correction means in said means for determining the frequency of the input signal, the error correcting means having means for storing a restricted range of values of the product of the relatively prime numbers, means in response to detecting a value lying outside said range for incrementing and/or decrementing at least one of the pair of residue values obtained by at least unity, and means for checking if the value obtained by said incrementing and/or decrementing operation lies within said restricted range of values.

11. An arrangement as claimed in claim 1 or 6, characterised in that each group comprises X stages arranged as sub-groups of y and z stages, where $X = y + z$; in that the local oscillator frequencies of successive stages in each group are different with the local oscillator frequencies of the y stages and z stages of each group forming an interrupted arithmetic progression and in that the pairwise differences in frequency between correspondingly numbered stages in the two groups form a continuous arithmetic progression.

12. An arrangement as claimed in claim 3, characterized in that the local oscillator frequency of a first stage in each of said first and second groups is the same.

13. An arrangement as claimed in claim 4, characterized in that the means for determining the frequency of the input signal comprises means forming a look-up table of the residues of dividing an input signal by modulo m and modulo n.

14. An arrangement as claimed in claim 3, characterized by error correction means in said means for determining the frequency of the input signal, the error correcting means having means for storing a restricted range of values of the product of the relatively prime numbers, means in response to detecting a value lying outside said range for incrementing and/or decrementing at least one of the pair of residue values obtained by at least unity, and means for checking if the value obtained by said incrementing and/or decrementing operation lies within said restricted range of values.

15. An arrangement as claimed in claim 4, characterized by error correction means in said means for determining the frequency of the input signal, the error correcting means having means for storing a restricted range of values of the product of the relatively prime numbers, means in response to detecting a value lying outside said range for incrementing and/or decrementing at least one of the pair of residue values obtained by at least unity, and means for checking if the value obtained by said incrementing and/or decrementing operation lies within said restricted range of values.

16. An arrangement as claimed in claim 8, characterized by error correction means in said means for determining the frequency of the input signal, the error correcting means having means for storing a restricted range of values of the product of the relatively prime numbers, means in response to detecting a value lying outside said range for incrementing and/or decrementing at least one of the pair of residue values obtained by at least unity, and means for checking if the value obtained by said incrementing and/or decrementing operation lies within said restricted range of values.

17. An arrangement as claimed in claim 9, characterized by error correction means in said means for determining the frequency of the input signal, the error correcting means having means for storing a restricted range of values of the product of the relatively prime numbers, means in response to detecting a value lying outside said range for incrementing and/or decrementing at least one of the pair of residue values obtained by at least unity, and means for checking if the value obtained by said incrementing and/or decrementing operation lies within said restricted range of values.

* * * * *